(12) United States Patent
Kasama et al.

(10) Patent No.: US 7,528,541 B2
(45) Date of Patent: May 5, 2009

(54) LIGHT-EMITTING ELEMENT AND LIGHT-EMITTING DEVICE

(75) Inventors: Yasuhiko Kasama, Sendai (JP); Kenji Omote, Sendai (JP)

(73) Assignee: Ideal Star Inc., Sendai-shi (JP)

( * ) Notice: Subject to any disclaimer, the term of this patent is extended or adjusted under 35 U.S.C. 154(b) by 203 days.

(21) Appl. No.: 10/563,379

(22) PCT Filed: Jul. 12, 2004

(86) PCT No.: PCT/JP2004/009945

§ 371 (c)(1), (2), (4) Date: May 15, 2006

(87) PCT Pub. No.: WO2005/006817

PCT Pub. Date: Jan. 20, 2005

(65) Prior Publication Data

US 2006/0238112 A1    Oct. 26, 2006

(30) Foreign Application Priority Data

Jul. 10, 2003   (JP) .............................. 2003-273100

(51) Int. Cl.
*H05B 33/00* (2006.01)
(52) U.S. Cl. .................. 313/504; 313/506; 428/917
(58) Field of Classification Search ............... None
See application file for complete search history.

(56) References Cited

U.S. PATENT DOCUMENTS 6,303,239 B1 * 10/2001 Arai et al. ................. 428/690
2002/0130312 A1 * 9/2002 Yu et al. ........................ 257/2
2006/0145365 A1 * 7/2006 Halls et al. ............ 257/E51.022

FOREIGN PATENT DOCUMENTS

| JP | 06-93258 | 4/1994 |
| JP | 08-310805 | 11/1996 |
| JP | 09-309711 | 2/1997 |
| JP | 2002-280176 | 9/2002 |
| JP | 2003-59657 | 2/2003 |
| JP | 2002-313582 | 10/2003 |

* cited by examiner

*Primary Examiner*—Ashok Patel
(74) *Attorney, Agent, or Firm*—Young & Thompson

(57) ABSTRACT

Organic materials doped with alkali metal have been conventionally used for electron transport layers or electron injection layers which constitute light-emitting films in organic EL light-emitting elements which are used in display devices or illuminating devices. Such conventional organic materials involve problems such that a strict process control is required since the alkali metal is highly reactive and thus, likely to be formed into a hydroxide, such that the resulting light-emitting element or light-emitting device needs complete sealing, and such that life of the light-emitting element cannot be sufficiently long. The present invention uses an alkali metal-including fullerene or an organic material doped with an alkali metal-including fullerene for electron transport layers or electron injection layers which constitute light-emitting films in organic EL light-emitting elements. The alkali metal-including fullerene or the organic material doped with an alkali metal-including fullerene is not very reactive with moisture or other impurities in the atmosphere and thus, the process control thereof is easy. Furthermore, even with a simple sealing structure, the resulting light-emitting element can be sufficiently long life.

6 Claims, 3 Drawing Sheets

(a)

(b)

LIGHT-EMITTING ELEMENT AND LIGHT-EMITTING DEVICE

FIELD OF THE INVENTION

The present invention relates to a light-emitting element and a light-emitting device having an organic EL as a light-emitting material used in a display device and an illuminating device.

BACKGROUND ART

Non-patent document 1: AMD Application Note Vol. 1 December, 2002 p. 1 to P. 19 Alkali Metal Dispenser for OLED Panted document 1: Japanese Patent Laid-open Publication No. 2001-6878, THIN FILM EL ELEMENT AND ITS DRIVING METHOD Various display devices characterized by its thin and flat structure such as a liquid-crystal display and a plasma display are now prevailing widely as a display device in place of a cathode-ray tube. Also, a display using an organic EL expected to be a main stream of the next-generation display is recently studied and developed. Since the organic EL converts electricity into light using electroluminescence, it hardly generates heat and uses less power. Also, it has a characteristic that a sharp image can be displayed regardless of the viewing angle, unlike the liquid-crystal display.

FIG. 8 is a sectional view of a conventional light-emitting element. The conventional light-emitting element is formed by sequentially laminating an anode 102, a positive-hole injection layer 103, a positive-hole transport layer 104, a light-emitting layer 105, an electron transport layer 106, an electron injection layer 107 and a cathode 108 on a glass substrate 101. For the anode, a transparent electrode material having a large work function, ITO (indium Tin Oxide) is used, while aluminum with a small work function is used for the cathode. As the light-emitting layer 105, a low molecular organic EL such as $Alq_3$ and NPB or a high molecular organic EL such as PPV and poly (3-alkylthiophene) is used. In order to improve bonding performance of the light-emitting layer between the anode and the cathode made of an inorganic material and the light-emitting layer made of an organic material, a positive-hole transport layer and a positive-hole injection layer are normally interposed between the light-emitting layer and the anode, and the light-emitting element is made in the multilayered structure by interposing an electron transport layer and an electron injection layer between the light-emitting layer and the cathode. Conventionally, as a material for the positive-hole transport layer or the positive-hole injection layer, an organic material such as TPD, PEDOT is used, while as the material for the electron transport layer or the electron injection layer, an organic material doped with alkali metal is used. By doping the organic layer on the cathode interface with alkali metal, a radical anion of the organic molecule is generated and it acts as an internal carrier at application of an electric field, which can reduce driving voltage of the organic EL (non-patent document 1).

However, there is a problem that in the organic material doped with alkali metal used as a material for the electron transport layer and the electron injection layer, the alkali metal has high reactivity and is likely to be formed into a hydroxide. Therefore, in order to prevent the organic material doped with alkali metal or formed thin film from reacting to moisture in the atmosphere or other impurities in the manufacturing process of a light-emitting element, there are problems that process control should be performed strictly, and sealing of the light-emitting element or the light-emitting device should be complete to prevent external air from leaking to the formed light-emitting element and reacting with steam. Also, it is difficult to form a light-emitting element with sufficiently long life.

As an electron transport layer, an EL element using a material including empty fullerene such as $C_{50}$, $C_{70}$ is known (patent document 1). However, the empty fullerene has a problem that electron affinity is relatively small, and electron injection efficiency is poor, and therefore, light-emitting efficiency is not high.

DISCLOSURE OF THE INVENTION

Problems to be Solved by the Invention

The present invention has an object to fabricate a light-emitting element which has manufacture process of the light-emitting element facilitated and sealing of the light-emitting element or a light-emitting device simplified with high light-emitting efficiency and long life of the light-emitting element.

Means to Solve the Problems

As a material for the electron transport layer or the electron injection layer, alkali metal-including fullerenes or organic materials doped with alkali metal-including fullerene are used.

The present invention (1) is a light-emitting element including an anode, a light-emitting layer and a cathode and having an electron injection layer and/or an electron transport layer interposed between the cathode and the light-emitting layer, characterized in that the above electron injection layer and/or the electron transport layer is alkali metal-including fullerenes or an organic material doped with alkali metal-including fullerene.

The "electron transport layer" here means a layer which transports an electron from the cathode to the light-emitting layer and blocks a hole moved from the anode side to prevent it from going out to the cathode, and the "electron injection layer" means a layer which enables smooth entering of an electron from the cathode to the transport layer (if the transport layer does not exist, the light-emitting layer). Different notations are included in the "electron transport layer and/or electron injection layer" in the present specification as long as it has these functions. Therefore, if a single layer having the both functions exists, for example, the layer corresponds to the "electron transport layer and/or electron injection layer."

The present invention (2) is a light-emitting element in the above element (1), wherein the electron transport layer is alkali metal-including fullerenes or an organic material doped with alkali metal-including fullerenes.

The present invention (3) is a light-emitting element in the above invention (1) or (2), wherein a positive-hole injection layer and/or positive-hole transport layer is interposed between the anode and the light-emitting layer.

The present invention (4) is a light-emitting device in which any one of the light-emitting elements in the above inventions (1) to (3) is arranged in plural in the array state or the matrix state.

The present invention (5) is a display device including the light-emitting device in the above invention (4).

The present invention (6) is an illuminating device including the light-emitting device in the above invention (4)

Effect of the Invention

1. Since in the alkali metal-including fullerenes, an alkali metal is confined in a fullerene, which is a spherical carbon cluster, the electron transport layer or the electron injection layer formed by the alkali metal-including fullerenes or an organic material doped with the alkali metal-including fullerenes has low reactivity with moisture in the atmosphere and other impurities. Therefore, the process control is facilitated, and a simplified sealing structure can be used for sealing the light-emitting element or the light-emitting device. Also, the life of the light-emitting element can be prolonged.

2. The alkali metal-including fullerenes or the organic material doped with the alkali metal-including fullerenes has higher electron mobility than the organic material doped with alkali metal. Therefore, the light-emitting efficiency of the light-emitting element is improved. Also, since the internal resistance of the light-emitting element is smaller, low-voltage driving is made possible.

3. The alkali metal-including fullerenes or the organic material doped with the alkali metal-including fullerenes has larger electron affinity than empty fullerene. Therefore, the electron injection efficiency is higher and the light-emitting efficiency is improved.

Figure 1:
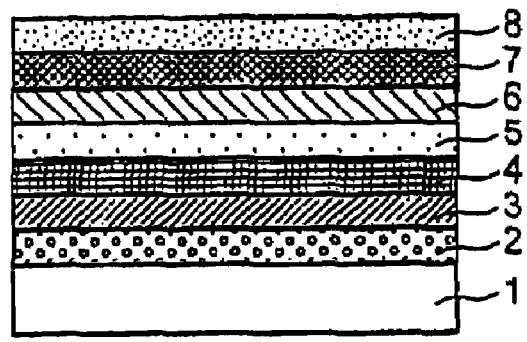
FIG. 1 is a sectional view of a light-emitting element according to a first preferred embodiment of the present invention.

DESCRIPTION OF REFERENCE NUMERALS 1, 17, 25, 32, 38, 48, 59, 101: Glass substrate
9: Plastic substrate
2, 10, 18, 26, 33, 53, 60, 102: Anode
3, 11, 19, 27, 42, 51, 103: Positive-hole injection layer
4, 12, 20, 28, 34, 43, 52, 104: Positive-hole transport layer
5, 13, 21, 29, 35, 54, 44, 61, 105: Light-emitting layer
6, 14, 22, 36, 45, 55, 62, 106: Electron transport layer
7, 15, 23, 30, 46, 56, 107: Electron injection layer
8, 16, 24, 31, 37, 57, 63, 108: Cathode
39: Source electrode
40: Semiconductor layer
41, 49: Gate electrode
47: Drain electrode
50: Gate insulating film
58: Protective insulating film
201: Column driver
202: Row driver

BEST MODE FOR CARRYING-OUT OF THE INVENTION

For this best mode for carrying-out of the invention, each layer will be described. First, an anode preferably uses an electrode material with a work function which is almost equal to or larger than that of HOMO level of a light-emitting layer. And in connection with application as a light-emitting element, it is preferable that at least either one of the anode or cathode is transparent or translucent. As such an electrode material, gold (in the form of translucent film) and ITO (Indium Tin Oxide) can be raised.

Next, the cathode preferably uses a stable electrode material with a smaller work function than that of the anode. For example, an alloy of aluminum, silver, Mg—In, Mg—Ag, etc. can be raised. In connection with the application as a light-emitting element, as above, it is preferable that at least either one of the anode or cathode is transparent or translucent.

An electron injection layer preferably uses a material with a small work function of such a degree to supplement the work function of the cathode when using a cathode with relatively high work function such as LiF and Mg, for example.

An electron transport layer may preferably use an organic material with a large electron affinity, having a hole blocking function and a large electron mobility such as BND, PBD, p-EtTAZ, BCP, etc., for example.

The characteristics of the present invention here are that the electron transport layer and/or electron injection layer (preferably at least electron transport layer) is alkali metal-including fullerenes or an organic material doped with the alkali metal-including fullerenes.

The "fullerenes" here is a concept including not only fullerene, hetero-fullerene and chemically modified fullerene but also repetitive bonded body of fullerenes (such as ion bond, covalent bond, etc.) such as a fullerene dimer. The "fullerene" here is a carbon cluster substance represented by Cn (n is an integral number of not less than 50: n=60, 70, 76, 78 . . . , for example) and $C_{60}$ can be cited, for example. In the case of repetitive bonded body, not all the fullerene units have to include alkali metal. In the case of dimer, for example, there can be a mode where only either one of the fullerenes includes alkali metal. The dope amount of the metal including fullerenes is preferably 0.1 wt % or more to an organic material. If 1 wt % is exceeded, the effect of the present invention is rapidly improved.

The organic material is not particularly limited, but conductive organic materials such as aluminum complex, oxadiazole, triazole and phenanthroline, conductive polymer (preferably N-type conductive polymer) are usable. For example, PBD, polyaniline, polyparaphenylene and polythiophene, poly (3-methylthiophene) can be raised. The electron transport layer and/or electron injection layer does not have to be constituted only by alkali metal-including fullerenes but other materials (empty fullerene or alkali metal, alkylammonium ion, etc. as a donor, for example) can be included, as long as the effect of the present invention is exerted.

A positive-hole injection layer may use a material with a work function or ionization potential which is enough to supplement the work function of the anode, when an anode with a relatively low work function is used, such as commonly used materials of the layer including TPD, copper phthalocyanine, PEDOT, polythiophene and polyaniline.

A positive-hole transport layer can use an organic material having an electron blocking function and large positive-hole mobility such as NPD, TPD, PEDOT, TPAC, etc., for example.

A material for a light-emitting layer is not particularly limited as long as it is the material causing light-emitting by re-bonding of the electron and hole. A low molecular organic EL such as $Alq_3$, NPB or a high-molecular organic EL such as PPV, poly (3-alkilthiophene), for example, can be used.

Next, a light-emitting element in which combination of the above layers are laminated will be described. First, the anode, light-emitting layer and cathode among the above layers are mandatory in the light-emitting element. And at least either one of the electron transport layer and the electron injection layer is mandatory, while existence of the other layer is optional. A concrete example of the combination of the above layers will be described below referring to drawings.

FIG. 1 is a sectional view of the light-emitting element according to a first example. The light-emitting element according to the first example of the present invention is a so-called passive-matrix driven light-emitting element in which the light-emitting element is controlled by an external driving element and it is a light-emitting element with multi-layered films between electrodes in the 5-layered structure. The light-emitting element is formed by sequentially laminating an anode 2, a positive-hole injection layer 3, a positive-hole transport layer 4, a light-emitting layer 5, an electron transport layer 6, an electron injection layer 7 and a cathode 8 on a glass substrate 1.

Figure 2:
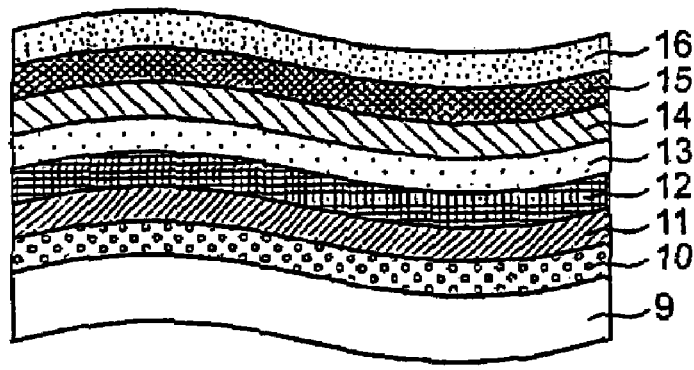
FIG. 2 is a sectional view of a light-emitting element according to a second preferred embodiment of the present invention.

FIG. 2 is a sectional view of a light-emitting element according to a second example. This is formed by sequentially laminating an anode 10, a positive-hole injection layer 11, a positive-hole transport layer 12, a light-emitting layer 13, an electron transport layer 14, an electron injection layer 15 and a cathode 16 on a plastic substrate 9. By using a light-weight flexible plastic substrate, applications are extended to a cell phone, an electronic paper, etc. Also, by using an inexpensive plastic substrate such as PET, cost reduction of the light-emitting element becomes possible. When a positive driving voltage is applied to the anode 10 with respect to the cathode 16 by an external driving circuit, an electron injected from a cathode 16 and a positive-hole injected from the anode 10 are re-bonded in the light-emitting layer 13, which causes the light-emitting layer 13.

Figure 3:
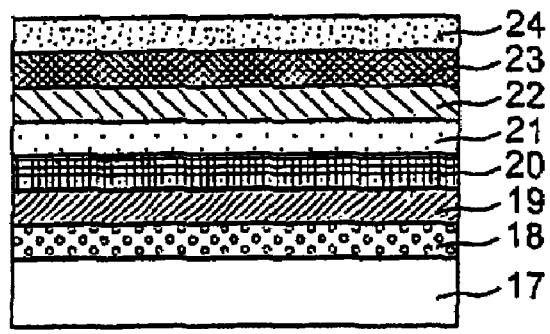
FIG. 3 is a sectional view of a light-emitting element according to a third preferred embodiment of the present invention.

FIG. 3 is a sectional view of a light-emitting element according to a third example. The light emitting element according to the third example is formed by sequentially laminating an anode 18, a positive-hole injection layer 19, a positive-hole transport layer 20, a light-emitting layer 21, an electron transport layer 22, an electron injection layer 23 and a cathode 24 on a glass substrate 17.

Figure 4:
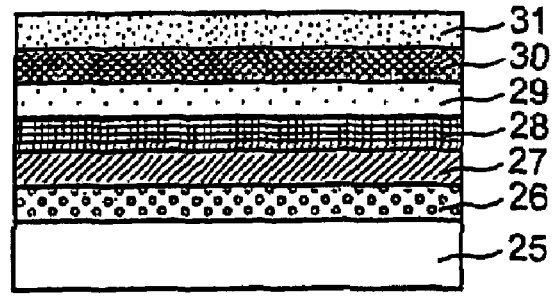
FIG. 4 is a sectional view of a light-emitting element according to a fourth preferred embodiment of the present invention.

FIG. 4 is a sectional view of a light-emitting element according to a fourth example. The light-emitting element according to the fourth example is formed by sequentially laminating an anode 26, a positive-hole injection layer 27, a positive-hole transport layer 28, a light-emitting layer 29, an electron injection layer 30 and a cathode 31 on a glass substrate 25.

Figure 5:
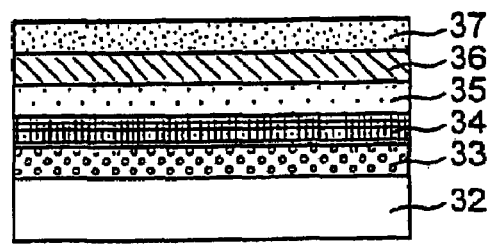
FIG. 5 is a sectional view of a light-emitting element according to a fifth preferred embodiment of the present invention.

FIG. 5 is a sectional view of a light-emitting element according to a fifth example. The light-emitting element according to the fifth example is formed by sequentially laminating an anode 33, a positive-hole injection layer 34, a light-emitting layer 35, an electron transport layer 36 and a cathode 37 on a glass substrate 32.

Figure 11:
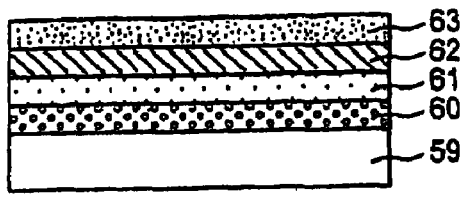
FIG. 11 is a sectional view of a light-emitting element according to an eighth preferred embodiment of the present invention.

FIG. 11 is a sectional view of a light-emitting element according to an eighth example. The light-emitting element according to the eighth example is formed by sequentially laminating an anode 60, a light-emitting layer 61, an electron transport layer 62 and a cathode 63 on a glass substrate 59.

Figure 6:
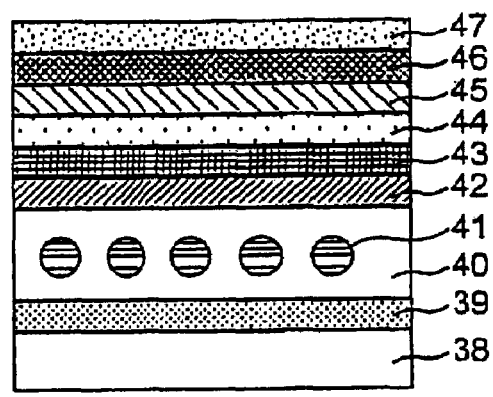
FIG. 6 is a sectional view of a light-emitting element according to a sixth preferred embodiment of the present invention.

FIG. 6 is a sectional view of a light-emitting element according a sixth example. The light-emitting element according to the sixth example is an active matrix driven light-emitting element in which each of the light-emitting elements has a driving element, and SIT is used as the driving element. This is formed by sequentially laminating a source electrode 39, a semiconductor layer 40, a positive-hole injection layer 42, a positive-hole transport layer 43, a light-emitting layer 44, an electron transport layer 45, an election injection layer 46 and a drain electrode 47 on a glass substrate 38. A gate electrode 41 is arranged in the comb-tooth state in the semiconductor layer 40. The semiconductor layer 40 is made of a P-type conductive organic material, for example, and the light-emitting intensity of the light-emitting element is controlled by applying a positive bias voltage to the gate electrode 41 made of aluminum or the like and controlling an electric current with a positive hole flowing from the source electrode 39 to the light-emitting layer 44 as a carrier.

Figure 7:
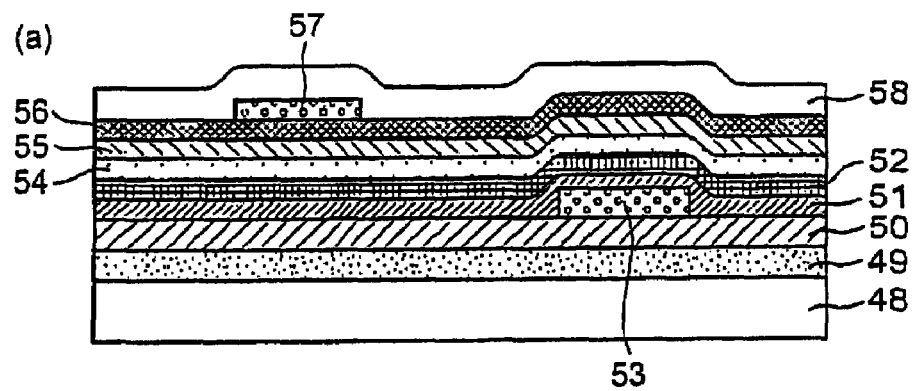
FIG. 7($a$) is a sectional view of a light-emitting element according to a seventh preferred embodiment of the present invention and (b) is circuit symbols representing a light-emitting element according to the seventh preferred embodiment of the present invention.
Figure 7:
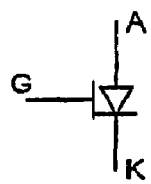
Figure 8:
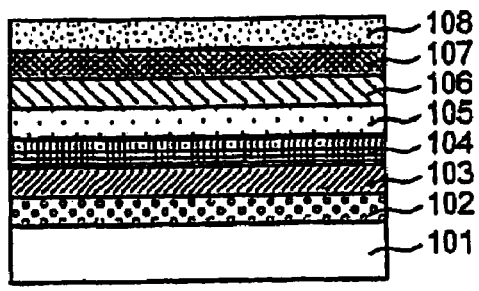
FIG. 8 is a sectional view of a conventional light-emitting element.

FIG. 7(a) is a sectional view of a light-emitting element according to a seventh example. The light-emitting element according to the seventh example is also an active matrix driven light-emitting element, and a MOS type current control structure is used as the driving element. On a glass substrate 48, a gate electrode 49 and a gate insulating film 50 are laminated and formed. On an anode 53 formed on the gate insulating film 50, a multi-layered film consisting of a positive-hole injecting layer 51, a positive-hole transport layer 52, a light-emitting layer 54, an electron transport layer 55 and an electron injection layer 56 is arranged, and a cathode 57 is arranged on the electron injection layer 56. The cathode 57 and the anode 53 are arranged at the position displaced in the lateral direction. For example, the cathode 57 is made as grounding potential, a positive bias voltage is applied to the anode 53, and an electric current with the positive hole as a carrier is injected from the anode 53. The electric current is controlled by applying a negative control voltage to the gate electrode 49 and by capturing a part of the positive hole injected from the anode. When the electron injected from the cathode 57 and the positive hole injected from the anode 53 are re-bonded in the light-emitting layer 54, which causes the light-emitting layer to emit light. The light-emitting intensity can be controlled by the control voltage applied to the gate electrode 49.

FIG. 7(b) is a circuit symbol representing a light-emitting element according to a seventh example and defined as representing a light-emitting diode using a MOS-type current control structure shown in FIG. 7(a) in this specification. A terminal indicated by A corresponds to the anode 53, a terminal indicated by K to the cathode 57 and a terminal indicated by G to the gate electrode 49, respectively.

Figure 9:
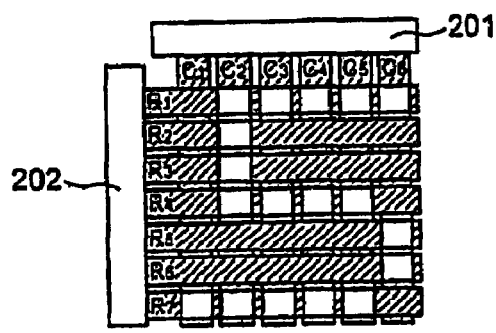
FIG. 9 is a plan view of a light-emitting device of a passive matrix driving method in the best mode.

FIG. 9 is a plan view of a light-emitting device in the passive matrix driving method of the present best mode. A bias voltage is applied by a column driver 201 and a row driver 202 arranged at the ends of an electrode holding between column electrodes C1 to C6 and row electrodes R1 to R7 in which the film-state light-emitting elements are arranged in the lattice state between them, and the light-emitting layer at the portion to which the bias voltage is applied from the column electrode and the row electrode at the same time is made to emit light.

Figure 10:
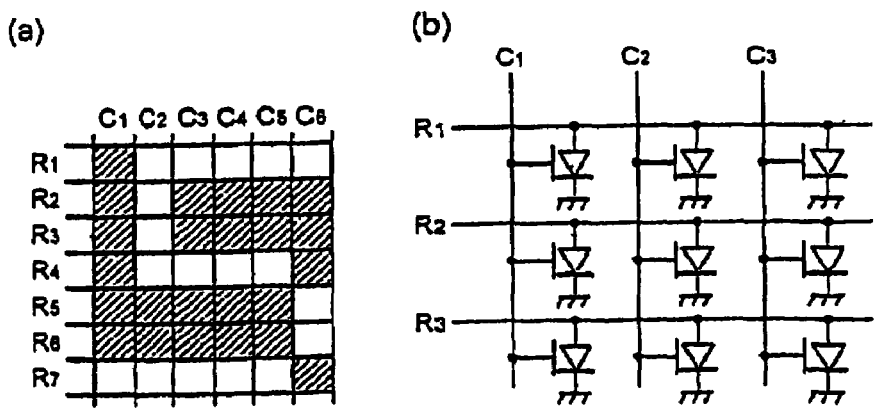
FIG. 10($a$) is a plan view of a light-emitting device of an active matrix driving method in the best mode, and (b) is a circuit diagram of a light-emitting device of an active matrix driving method in the best mode.

FIG. 10(a) is a plan view of a light-emitting device in the active matrix driving method of the present best mode. FIG. 10(b) is a circuit diagram of the light-emitting device in the active matrix driving method of the present best mode. In the light-emitting element arranged in the array state shown in FIG. 10(a), each of the light emitting elements has a driving element for performing control by MOS structure. As shown in FIG. 10(b), each of the column wirings C1 to C3 is connected to the gate electrode of the driving element, while each of the row wirings R1 to R3 is connected to the anode of the driving element. The cathode of the driving element is connected to grounding potential. A bias voltage is applied to the row wiring to select the row of the light-emitting element to be controlled, and the light-emitting intensity of the light emitting element in each column in the selected row is controlled by controlling the control voltage to be applied to each of the column wirings. In FIG. 10, description was made referring to an example of the driving element controlled by the MOS structure as an element for driving a light-emitting element, but it is obvious that the effect of the present invention can be obtained similarly if another driving element is used.

EXAMPLE

The present invention will be described below in detail referring to a preferred embodiment. The technical scope of the present invention is not limited to this preferred embodiment.

The result of actual manufacture and evaluation of a light-emitting element will be described. As a light-emitting element according to a comparative example, a light-emitting element using an organic material film doped with alkali metal for an electron transport layer was evaluated. As a light-emitting element according to the preferred embodiment, a light-emitting element using an including fullerene film for an electron transport layer and a light-emitting element using an organic material film doped with including fullerene for an electron transport layer were evaluated. As a light-emitting element for evaluation, 10 units of each element were prepared in the respective manufacturing methods.

Manufacture of a Light-Emitting Element According to the Comparative Example

A transparent glass substrate (Corning 1713, 30 mm×30 mm, thickness: 0.8 mm) is prepared, and a thin film made of ITO is accumulated by the thickness of 340 Å by the sputtering method on the glass substrate to form an anode. On the anode, a thin film made of copper phthalocyanine by Tokyo Kasei Kogyo Co., Ltd. (product name: P1005) is accumulated by the thickness of 10 Å by the deposition method to form a positive-hole injection layer. Then, on the positive-hole injection layer, a thin film made of NPD by Aldrich (product name: 55,669-6) is accumulated by the thickness of 1000 Å by the deposition method to form a positive-hole transport layer. Next, Alq3 by Dojindo Laboratories (product name: T203) is sublimated and purified. And a thin film made of the purified Alq3 is accumulated on the positive-hole injection layer by the thickness of 500 Å by the deposition method to form a light-emitting layer. Next, PBD by Aldrich (product name: 25,785-0) is sublimated and purified. And on the light-emitting layer, a thin film made of PBD doped with Na is accumulate by the thickness of 500 Å by the co-deposition method with the purified PBD and Na as a deposition source to form an electron transport layer. Then, on the electron transport layer, a thin film made of LiF is accumulated by the thickness of 5 Å by the deposition method to form an electron injection layer. And on the electron injection layer, a thin film made of Al is accumulated by the thickness of 1000 Å by the deposition method to form a cathode. Then, on the cathode, a transparent glass substrate (Corning 1713, 30 mm×30 m, thickness: 0.8 mm) is applied to obtain a light-emitting element according to the Comparative Example.

Manufacture of a Light-Emitting Element According to the Example 1

A transparent glass substrate (Corning 1713, 30 mm×30 mm, thickness: 0.8 mm) is prepared, and a thin film made of ITO is accumulated by the thickness of 340 Å by the sputtering method on the glass substrate to form an anode. On the anode, a thin film made of copper phthalocyanine by Tokyo Kasei Kogyo Co., Ltd. (product name: P1005) is accumulated by the thickness of 10 Å by the deposition method to form a positive-hole injection layer. Then, on the positive-hole injection layer, a thin film made of NPD by Aldrich (product name: 55,669-6) is accumulated by the thickness of 1000 Å by the deposition method to form a positive-hole transport layer. Next, Alq3 by Dojindo Laboratories (product name: T203) is sublimated and purified. And a thin film made of the purified Alq3 is accumulated on the positive-hole injection layer by the thickness of 500 Å by the deposition method to form a light-emitting layer. And 50 mg of Na@$C_{60}$ by Ideal Star Inc. is set on molybdenum boat by The Nilaco Corporation (SS-1-10), and then, the substrate is placed 10 cm above, 100 mA is applied to the above boat under the degree of vacuum of $10^{-6}$ torr, and Na@$C_{60}$ is heated and sublimated at 600° C. for 60 seconds and accumulated on the substrate to form an electron transport layer made of a thin film of the thickness of 500 Å. Then, on the electron transport layer, a thin film made of LiF is accumulated by the thickness of 5 Å by the deposition method to form an electron injection layer. And on the electron injection layer, a thin film made of Al is accumulated by the thickness of 1000 Å to form a cathode. Then, on the cathode, a transparent glass substrate (Corning 1713, 30 mm×30 m, thickness: 0.8 mm) is applied to obtain a light-emitting element according to the Example 1.

Manufacture of a Light-Emitting Element According to the Example 2

A transparent glass substrate (Corning 1713, 30 mm×30 mm, thickness: 0.8 mm) is prepared, and a thin film made of ITO is accumulated by the thickness of 340 Å by the sputtering method on the glass substrate to form an anode. On the anode, a thin film made of copper phthalocyanine by Tokyo Kasei Kogyo Co., Ltd. (product name: P1005) is accumulated by the thickness of 10 Å by the deposition method to form a positive-hole injection layer. Then, on the positive-hole injection layer, a thin film made of NPD by Aldrich (product name: 55,669-6) is accumulated by the thickness of 1000 Å by the deposition method to form a positive-hole transport layer. Next, Alq3 by Dojindo Laboratories (product name: T203) is sublimated and purified. And a thin film made of the purified Alq3 is accumulated on the positive-hole injection layer by the thickness of 500 Å by the deposition method to form a light-emitting layer. And 20 mg of PBD by Aldrich (product name: 25,785-0) is sublimated and purified. 10 mg of Na@$C_{60}$ by Ideal Star Inc. is prepared, a thin film made of PBD doped with Na@C$_{60}$ is accumulated on the light-emitting layer by the thickness of 500 Å by the co-deposition method with the purified PBD and Na@C$_{60}$ as the deposition source according to the manufacture of the light-emitting element according to the Example 1 to form an electron transport layer. As a forming condition of the electron transport layer, the heating temperature of PBD is set at 700° C. and the heating temperature of Na@C$_{60}$ is set at 600° C. Next, on the electron transport layer, a thin film made of LiF is accumulated by the thickness of 5 Å by the deposition method to form an electron injection layer. And on the electron injection layer, a thin film made of Al is accumulated by the thickness of 1000 Å by the deposition method to form a cathode. Then, on the cathode, a transparent glass substrate (Corning 1713, 30 mm×30 m, thickness: 0.8 mm) is applied to obtain a light-emitting element according to the Example 2.

Evaluation Method of Light-Emitting Element

The light-emitting efficiency (cd/A) and the minimum driving voltage (V) of the light-emitting elements according to the Examples 1 and 2 as well as the Comparative Example manufactured by the above methods are measured in a normal laboratory environment with a normal temperature and a normal pressure within 5 hours after formation of the cathode. The minimum driving voltage is defined as starting voltage of the light emission of 200 cd/m$^2$. The measurement data shown below is an average value of measured values of 10 light-emitting elements manufactured by each of the manufacturing methods.

| Light-emitting element | Light-emitting efficiency (cd/A) | Minimum driving voltage (V) |
| --- | --- | --- |
| Comparative Example | 4.2 | 4.5 |
| Example 1 | 9.5 | 3.8 |
| Example 2 | 8.2 | 4.3 |

As can be known from the above measurement data, both the light-emitting elements in the Examples 1 and 2 have improved light-emitting efficiency as compared with the light-emitting element in the Comparative Example. Regarding the minimum driving voltage, both the Examples 1 and 2 are improved as compared with the conventional light-emitting element, but improvement is particularly large in the Example 1.

INDUSTRIAL APPLICABILITY

Since alkali metal is confined in the fullerene, which is a spherical carbon cluster, in the alkali metal-including fullerenes, an electron transport layer or an electron injection layer formed by alkali metal-including fullerenes or an organic material doped with alkali metal-including fullerenes has low reactivity with moisture in the atmosphere and other impurities. Therefore, process control is facilitated and a simplified sealing structure can be used for sealing of a light-emitting element or a light-emitting device. Also, the life of the light-emitting element can be prolonged.

The alkali metal-including fullerenes or organic material doped with the alkali metal-including fullerenes have larger electron mobility than the organic material doped with alkali metal. Therefore, the light-emitting efficiency of the light-emitting element is improved. Also, since the internal resistance of the light-emitting element is smaller, low-voltage driving is made possible.

The alkali metal-including fullerenes or organic material doped with the alkali metal-including fullerenes have larger electron affinity than an empty fullerene. Therefore, electron injection efficiency is high and the light-emitting efficiency is improved.

The invention claimed is:

1. A light-emitting element, comprising:
   an anode;
   a cathode;
   a light-emitting layer between said anode and said cathode; and
   at least one of an electron injection layer and an electron transport layer interposed between the anode and the light-emitting layer,
   wherein said at least one of said electron layer and said electron transport layer is made of alkali metal-including fullerenes or an organic material doped with alkali metal-including fullerene.

2. A light-emitting element as in claim 1, comprising said electron transport layer, wherein the electron transport layer is alkali metal-including fullerenes or an organic material doped with alkali metal-including fullerene.

3. A light-emitting element as in claim 1 further comprising at least one of a positive-hole injection layer and a positive-hole transport layer interposed between the anode and the light-emitting layer.

4. A light-emitting device in which a plurality of the light-emitting elements claim 3 are arranged in array or matrix state.

5. A display device comprising the light-emitting device in claim 4.

6. An illuminating device comprising the light-emitting device in claim 4.

* * * * *